(12) United States Patent
Ha et al.

(10) Patent No.: US 11,283,470 B2
(45) Date of Patent: Mar. 22, 2022

(54) METHOD FOR CONSTRUCTING PARITY-CHECK CONCATENATED POLAR CODES AND APPARATUS THEREFOR

(71) Applicant: Korea Advanced Institute of Science and Technology, Daejeon (KR)

(72) Inventors: Jeongseok Ha, Daejeon (KR); Kyung Mok Oh, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 16/917,165

(22) Filed: Jun. 30, 2020

(65) Prior Publication Data
US 2021/0006267 A1    Jan. 7, 2021

(30) Foreign Application Priority Data
Jul. 1, 2019    (KR) .......................... 10-2019-0078570

(51) Int. Cl.
| | |
|---|---|
| *H03M 13/25* | (2006.01) |
| *H03M 13/09* | (2006.01) |
| *H03M 13/00* | (2006.01) |
| *H03M 13/11* | (2006.01) |
| *H03M 13/01* | (2006.01) |
| *H03M 13/13* | (2006.01) |

(52) U.S. Cl.
CPC ......... *H03M 13/253* (2013.01); *H03M 13/01* (2013.01); *H03M 13/098* (2013.01); *H03M 13/1117* (2013.01); *H03M 13/13* (2013.01); *H03M 13/616* (2013.01)

(58) Field of Classification Search
CPC ............. H03M 13/253; H03M 13/098; H03M 13/616; H03M 13/1117; H03M 13/01; H03M 13/13; H03M 13/2906; H03M 13/033; H03M 13/29; H03M 13/3707; H03M 13/6502
See application file for complete search history.

(56) References Cited

U.S. PATENT DOCUMENTS

2020/0059253 A1* 2/2020 Chen ................. H03M 13/13
2021/0006267 A1* 1/2021 Ha .................... H03M 13/13

* cited by examiner

*Primary Examiner* — Thien Nguyen
(74) *Attorney, Agent, or Firm* — Foley & Lardner LLP (57) ABSTRACT

A method for constructing parity-check concatenated polar codes and an apparatus therefor are disclosed. According to an embodiment of the inventive concept, a method for constructing a polar code includes receiving a code length, a message length, and channel information, generating an information set and a parity set of polar codes based on the received code length, the received message length, and the received channel information, and generating a parity node including the information set of elements based on the generated information set and the generated parity set.

17 Claims, 6 Drawing Sheets

Input : A', P
Output : $H_1, H_1, ..., H_{|P|}$

Initialization : $H_1 = H_2 = \cdots H_{|P|} = \emptyset$
1.   for $p_i \in P$ do
2.       for $a_j \in A'$ and $a_j < p_j$ do
3.          if $w_H(\text{BIN}(a_j \text{ AND } p_i)) < w_H(\text{BIN}(a_j))$
4.             $H_i = H_i \cup \{a_j\}$
5.          end if
6.       end for
7.   end for
8.   return $H_1, H_2, ..., H_{|P|}$

METHOD FOR CONSTRUCTING PARITY-CHECK CONCATENATED POLAR CODES AND APPARATUS THEREFOR

CROSS-REFERENCE TO RELATED APPLICATIONS

A claim for priority under 35 U.S.C. § 119 is made to Korean Patent Application No. 10-2019-0078570 filed on Jul. 1, 2019, in the Korean Intellectual Property Office, the entire contents of which are hereby incorporated by reference.

BACKGROUND

Embodiments of the inventive concept described herein relate to a technology for constructing a polar code, and more particularly, relate to a polar code constructing method capable of improving a minimum distance and an error correction capability of a code by concatenating a polar code and a parity-check code, and an apparatus therefor.

A polar code is the first code known to achieve channel capacity in a binany-input discrete memoryless symmetric channel and has attracted much attention as the core technology of a control signal standard of 5G enhanced mobile broadband (eMBB) and ultra-reliable and low latency communications (URLLC). The polar code is constructed through a channel polarization process. According to a channel polarization theory, when 'N' is infinitely large by converting 'N' binary-input discrete memoryless symmetric channels having the channel capacity of 'C', it is possible to generate NC channels with high reliability and N(1−C) channels with low reliability. At this time, when the intended message is transmitted to a channel with high reliability and a value known by a sender/receiver is transmitted to a channel with low reliability, the receiver may completely recover the original message with the complexity of "N log(N)" using a successive-cancellation decoder. However, when the length of the code is finite, a partially polarized channel is present; accordingly, the error correction capability of the successive-cancellation decoder is lowered compared with other codes. To overcome this, the technology of the conventional embodiment has proposed a list successive-cancellation decoder and cyclic redundancy check (CRC) concatenated codes. In the corresponding technology, CRC codes are added to a message and then the message is transmitted; the receiver generates a candidate list of the message by using a list decoder and finds the correct message in the list through CRC check. The conventional technology showed that the polar code may outperform the conventional code when such the method is used. However, for URLLC service of 5G, a lower error rate is required compared with the conventional method. Because the CRC code is not optimized for the polar code, an advanced method is required.

The conventional polar code is constructed through the following steps. The code word $c_1^N$ of a polar code having the length of 'N' is generated by multiplying a message vector $u_1^N$ by a matrix $G = F^{\otimes n}$. At this time, there are $$F = \begin{bmatrix} 1 & 0 \\ 1 & 1 \end{bmatrix}$$

and 'n=log N'. The reliability of the elements of each message vector is determined by calculating the Bhattacharyya parameter of the polarized channels $W_N^{(i)}(y_1^N u_1^{i-1}|u_i)$ (i=1, 2, . . . , N). At this time, 'k' elements with high reliability are referred to as "information bits"; the set of indexes is defined as information set $\mathcal{A}$. The remaining 'N-k' elements with low reliability are referred to as "frozen bits"; likewise, the set of indexes is defined as frozen set $\mathcal{F}$. The minimum distance $d_{min}$ of the polar code thus generated is expressed as $2^{\min_{i \in \mathcal{A}} w_H(\text{BIN}(i-1)) w_H(\text{BIN}(i-1))}$; $w_H$ denotes Hamming weight (the number of 1s in a vector) of a binary vector; BIN denotes a function of converting a decimal number to a binary vector. The polar codes constructed in the conventional scheme generally have a low minimum distance because the algebraic properties of the information set are not considered in the polar codes.

Accordingly, there is a need for the method for constructing a polar code that is capable of improving the error correction capability while improving a minimum distance.

SUMMARY

Embodiments of the inventive concept provide a polar code constructing method capable of improving the minimum distance and the error correction capability of a code by concatenating a polar code and a parity-check code, and an apparatus therefor.

According to an exemplary embodiment, a method for constructing a polar code includes receiving a code length, a message length, and channel information, generating an information set and a parity set of polar codes based on the received code length, the received message length, and the received channel information, and generating a parity node including the information set of elements based on the generated information set and the generated parity set.

The generating of the parity set may include generating indexes, each of which is not greater than a preset Hamming weight among all indexes, as a frozen set of the polar codes, generating indexes, which are selected by a preset scheme among remaining indexes other than indexes selected as the frozen set, as a parity set, and generating indexes other than indexes selected as the parity set among the remaining indexes, as the information set.

The generating of the indexes as the parity set may include calculating a Bhattacharyya parameter of a polarized channel with respect to the remaining indexes and generating indexes for an upper scale having a specific number as the parity set after sorting the calculated Bhattacharyya parameter.

The generating of the parity node may include finding information indexes, each of which is smaller than a corresponding index of the parity set, from among the information set of indexes with respect to the parity set of respective indexes and generating a parity node by determining the information set of elements included in the respective parity node based on a weight value of the sum of a vector for the corresponding index and a vector for each of the information indexes and a weight value of a vector for each of the information indexes.

The generating of the parity node may include generating a parity node by determining an information index at a time when a weight value for a logical product of a vector for the corresponding index and a vector for each of the information indexes is less than a weight value for a vector for each of the information indexes, as the information set of elements included in a corresponding parity node.

Furthermore, according to an embodiment of the inventive concept, the method for constructing a polar code may further include calculating a weight value of a vector corresponding to each of indexes of the parity set and a weight value of a vector corresponding to each of indexes of the information set and determining indexes of the information set having a weight value, which is not greater than a highest weight value, from among weight values for the respective indexes of the parity set as a candidate set. The generating of the parity node may include generating the parity node including the candidate set of elements based on the candidate set and the parity set.

According to an exemplary embodiment, a method for constructing a polar code may include receiving a code length, a message length, and channel information, generating an information set and a parity set of polar codes based on the received code length, the received message length, and the received channel information, and constructing a polar code concatenated with a parity-check code based on the generated information set and the generated parity set.

The generating of the parity set may include generating indexes, each of which is not greater than a preset Hamming weight among all indexes, as a frozen set of the polar codes, generating indexes, which are selected by a preset scheme among remaining indexes other than indexes selected as the frozen set, as a parity set, and generating indexes other than indexes selected as the parity set among the remaining indexes, as the information set.

The generating of the indexes as the parity set may include calculating a Bhattacharyya parameter of a polarized channel with respect to the remaining indexes and generating indexes for an upper scale having a specific number as the parity set after sorting the calculated Bhattacharyya parameter.

The constructing of the polar code may include finding information indexes, each of which is smaller than a corresponding index of the parity set, from among the information set of indexes with respect to the parity set of respective indexes and generating a parity node by determining the information set of elements included in the respective parity node based on a weight value of the sum of a vector for the corresponding index and a vector for each of the information indexes and a weight value of a vector for each of the information indexes.

Furthermore, according to an embodiment of the inventive concept, the method for constructing a polar code may further include calculating a weight value of a vector corresponding to each of indexes of the parity set and a weight value of a vector corresponding to each of indexes of the information set and determining indexes of the information set having a weight value, which is not greater than a highest weight value, from among weight values for the respective indexes of the parity set as a candidate set. The constructing of the polar code may include constructing the polar code concatenated with the parity-check code by generating the parity node including the candidate set of elements based on the candidate set and the parity set.

According to an exemplary embodiment, a polar code constructing apparatus includes a reception unit receiving a code length, a message length, and channel information, a set generation unit generating an information set and a parity set of polar codes based on the received code length, the received message length, and the received channel information, and a parity node generation unit generating a parity node including the information set of elements based on the generated information set and the generated parity set.

The set generation unit may generate indexes, each of which is not greater than a preset Hamming weight among all indexes, as a frozen set of the polar codes, generates indexes, which are selected by a preset scheme among remaining indexes other than indexes selected as the frozen set, as a parity set, and may generate indexes other than indexes selected as the parity set among the remaining indexes, as the information set.

The set generation unit may calculate a Bhattacharyya parameter of a polarized channel with respect to the remaining indexes, and may generate indexes for an upper scale having a specific number as the parity set after sorting the calculated Bhattacharyya parameter.

The parity node generation unit may find information indexes, each of which is smaller than a corresponding index of the parity set, from among the information set of indexes with respect to the parity set of respective indexes, and may generate a parity node by determining the information set of elements included in the respective parity node based on a weight value of the sum of a vector for the corresponding index and a vector for each of the information indexes and a weight value of a vector for each of the information indexes.

The parity node generation unit may generate a parity node by determining an information index at a time when a weight value for a logical product of a vector for the corresponding index and a vector for each of the information indexes is less than a weight value for a vector for each of the information indexes, as the information set of elements included in a corresponding parity node.

Furthermore, according to an embodiment of the inventive concept, the polar code constructing apparatus may further include a determination unit calculates a weight value of a vector corresponding to each of indexes of the parity set and a weight value of a vector corresponding to each of indexes of the information set and determines indexes of the information set having a weight value, which is not greater than a highest weight value, from among weight values for the respective indexes of the parity set as a candidate set. The parity node generation unit may generate the parity node including the candidate set of elements based on the candidate set and the parity set.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Advantage points and features of the inventive concept and a method of accomplishing thereof will become apparent from the following description with reference to the following figures, wherein embodiments will be described in detail with reference to the accompanying drawings. The inventive concept, however, may be embodied in various different forms, and should not be construed as being limited only to the illustrated embodiments. Rather, these embodiments are provided as examples so that the inventive concept will be thorough and complete, and will fully convey the concept of the inventive concept to those skilled in the art. The inventive concept may be defined by scope of the claims. Meanwhile, the terminology used herein to describe embodiments of the inventive concept is not intended to limit the scope of the inventive concept.

The terms used herein are provided to describe the embodiments but not to limit the inventive concept. In the specification, the singular forms include plural forms unless particularly mentioned. The terms "comprises" and/or "comprising" used herein does not exclude presence or addition of one or more other components, steps, operations, and/or elements in addition to the aforementioned components, steps, operations, and/or elements.

Unless otherwise defined, all terms (including technical and scientific terms) used herein have the same meaning as commonly understood by those skilled in the art to which the inventive concept pertains. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein.

Hereinafter, exemplary embodiments of the inventive concept will be described in detail with reference to the accompanying drawings. The same reference numerals are used for the same components in the drawings and redundant explanations for the same components are omitted.

Embodiments of the inventive concept are directed to construct a polar code capable of improving the minimum distance and error correction capability of a code by concatenating the polar code and a parity-check code.

The conventional used method utilizes CRC codes; However, in the inventive concept, when parity codes are concatenated instead of standardized CRC codes because parity-check codes are used, there is a need for the construction method different from the conventional construction method. Herein, the parity-check codes utilized in the inventive concept may be constructed in a manner of maximizing the minimum distance of a polar code and maximizing the error correction performance.

In the inventive concept, the parity set $\mathcal{P}$ is additionally defined in addition to the information set and the frozen set of polar codes. The value of the message corresponding to the parity set may be generated as the sum of several of the previous information sets and may be expressed as Equation 1 below.

$$u_i = \sum_{j \in H_i} u_j, i \in \mathcal{P} \qquad \text{[Equation 1]}$$

Herein, $H_i$ may denote the set of information bits to be added to generate the i-th parity bit and may be a parity node.

Figure 1:
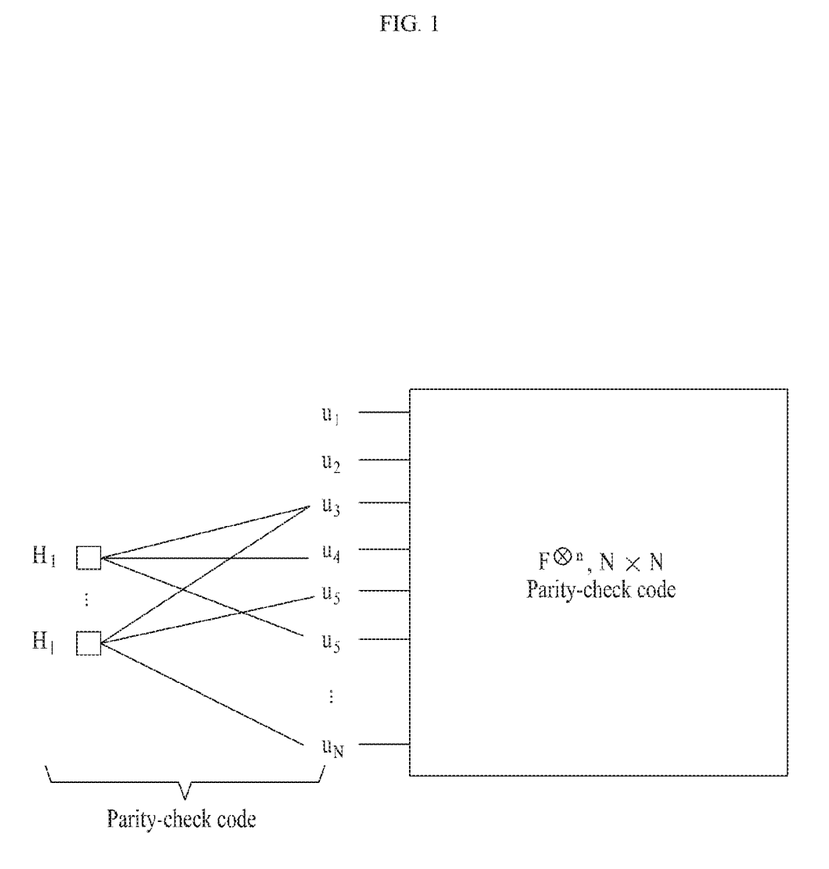
FIG. 1 illustrates one exemplary view of a concatenation structure of a parity-check code and a polar code.

For example, assuming that $H_1$ is defined as shown in FIG. 1, it is determined that $u_6$ is "$u_3+u_4$". The inventive concept describes a technology for constructing a polar code concatenated with the parity-check code.

Figure 2:
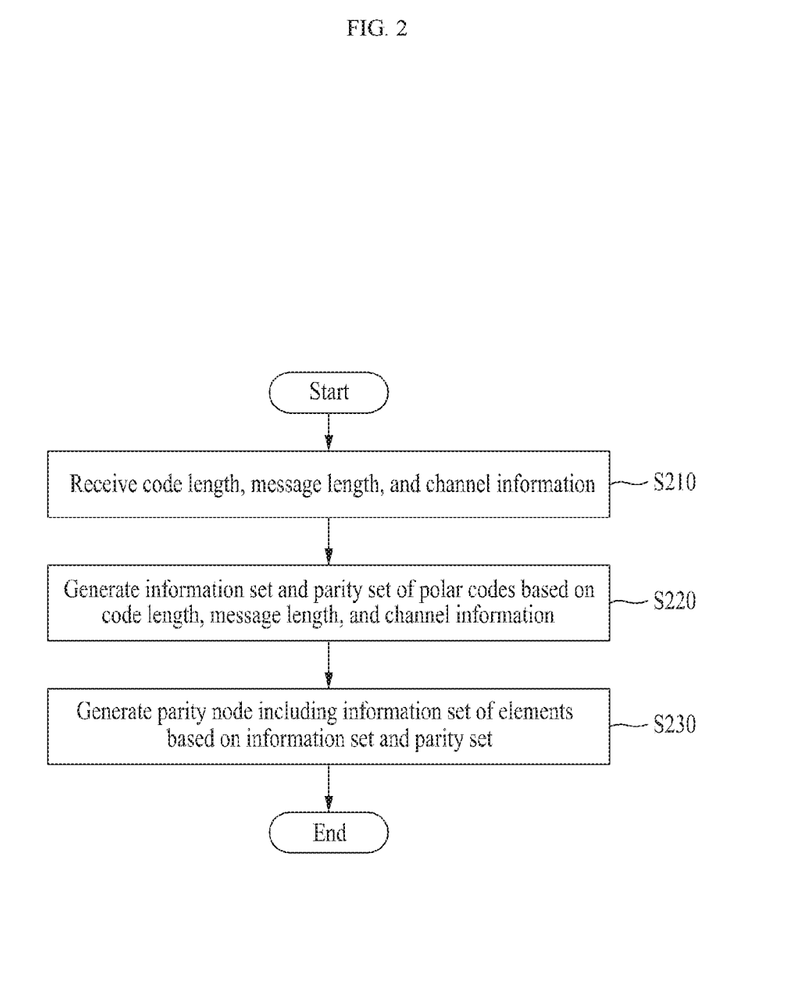
FIG. 2 illustrates an operation flowchart of a polar code constructing method according to an embodiment of the inventive concept.

FIG. 2 illustrates an operation flowchart of a polar code constructing method according to an embodiment of the inventive concept, and illustrates an operation flowchart of a method for constructing a polar code from concatenating a parity-check code.

Referring to FIG. 2, the polar code constructing method according to an embodiment of the inventive concept receives the code length of 'N', the message length of 'k', and the channel of 'W' (the matrix indicating channel characteristics) and generates the information set and parity set of polar codes based on the received code length, message length and channel information (S210 and S220).

Herein, referring to FIG. 1 as an example, step S220 may generate indexes, each of which is not greater than a preset Hamming weight among all indexes for the N×N matrix of the polar code, as a frozen set of polar codes, may generate indexes, which are selected by a preset scheme among the remaining indexes other than indexes selected as the frozen set, as a parity set, and may generate indexes other than the indexes selected as the frozen set and the parity set among all indexes, as the information set.

At this time, step S220 may select the parity set of indexes by calculating a Bhattacharyya parameter of the polarized channel. In particular, step S220 may calculate the Bhattacharyya parameter of the polarized channel with respect to the remaining indexes other than the indexes selected as the frozen set. After sorting the calculated Bhattacharyya parameter, step S220 may generate a parity set by selecting the indexes for the upper scale of the remaining number other than the number for the indexes of the information set.

When the frozen set, the information set, and the parity set of polar codes are generated by step S220, i.e., when the frozen set, the information set, and the parity set of the indexes are selected, step S230 generates a parity node of the parity-check code based on the generated parity set and information set (S230).

Herein, step S230 may find indexes (information indexes), each of which is smaller than the corresponding index of the parity set, from among the information set of indexes with respect to the parity set of respective indexes, and may generate a parity node by determining the information set of elements included in each parity node based on a weight value of the sum of a vector for the corresponding index of the parity set and a vector for each of information indexes and a weight value of a vector for each of information indexes. For example, step S230 may generate a parity node by determining the information index at the time when the weight value for the logical product of the vector for the corresponding index of the parity set and the vector for each of the information indexes is less than a weight value for the vector for each of the information indexes, as the information set of elements included in the corresponding parity node.

Furthermore, step S230 may calculate a weight value of a vector corresponding to each of indexes of the parity set and a weight value of a vector corresponding to each of the indexes of the information set, may determine indexes of the information set having a weight value, which is not greater than the highest weight value, from among weight values for the respective indexes of the parity set as a candidate set, and may generate a parity node including the candidate set of elements based on the candidate set and the parity set.

At this time, the inventive concept may improve the minimum distance and error correction capability of the code while reducing the computational complexity of constructing parity-check concatenated polar codes through the process of determining the candidate set for the information set.

The method of this inventive concept will be described in detail with reference to FIGS. 3A to 5 as follows.

According to an embodiment of the inventive concept, when the code length of 'N', the message length of 'k', and the channel of 'W' (the matrix indicating channel characteristics) are given as inputs, the method generates the information set, the frozen set $\mathcal{A}, \mathcal{F}, \mathcal{P}$, the parity set and parity nodes $H_i$ of polar codes, the minimum distance of each of which is increased, through the following process.

1. Initialization: Initialize all sets to an empty set, that is $\mathcal{A} = \mathcal{F} = \mathcal{P} = \phi$.

2. Generate frozen set $\mathcal{F}$: Find the largest value of 's' that satisfies Equation 2 below.

$$\binom{n}{1} + \binom{n}{2} + \ldots + \binom{n}{s} < N - k \quad \text{[Equation 2]}$$

That is, when indexes are converted to a binary vector among all indexes $\{0, 1, 2, \ldots, N-1\}$, the indexes, each of which Hamming weight is not greater than 's', are define as frozen set $\mathcal{F} = \{i | w_H(i-1) \leq s, i=1,2, \ldots, N\}$.

3. Generate parity set $\mathcal{P}$: Bhattacharyya parameter $Z(W_N^{(i)})$, $i=1,2,\ldots, N$ of the polarized channel is calculated with respect to the remaining indexes other than the indexes selected as the frozen set. That is, the inventive concept sorts the remaining indexes other than the index already selected as the frozen set in the order from the highest to the lowest Bhattacharyya parameter and then generates indexes for the upper scale of the remaining number other than the number 'k' for indexes of the information set, as the information set.

4. Generate information set $\mathcal{A}$: The information set refers to a set $\mathcal{A} = \{1,2, \ldots, N\} \backslash (\mathcal{F} \cup \mathcal{P})$ of elements other than the frozen set and the parity set in index set $\{0, 1, 2, \ldots, N-1\}$. That is, the information set may generate the remaining indexes other than indexes of the frozen set and the parity set, among all the indexes as the information set.

5. Generate parity node $H_i$: The parity node $H_i$ has an index of information bits to be added to generate the parity bit $u_i$, as an element. Assuming that the sets $\mathcal{A} = \{a_1, a_2, \ldots, a_k\}$, $\mathcal{F} = \{f_1, f_2, \ldots, f_m\}$, and $\mathcal{P} = \{p_1, p_2, \ldots, p_l\}$ are defined through the above-described processes 1 to 4, the subset $\mathcal{A}'$ of $\mathcal{A}$ may be defined as Equation 3 below when the subset $\mathcal{A}'$ of $\mathcal{A}$ is assumed as a candidate set.

$$\mathcal{A}' = \left\{ j \middle| w_H(j) \leq \max_{i \in \mathcal{P}} w_H(i), j \in \mathcal{A} \right\} \quad \text{[Equation 3]}$$

That is, the candidate set refers to a set obtained by finding an element with the largest Hamming weight in the parity set and collecting indexes lower than the weight in the information set. Afterward, with respect to each $p_i$, all elements of $\mathcal{A}'$ satisfying the two conditions in Equation 4 below are included in $H_i$.

A. $a_j < p_i, a_j \in \mathcal{A}'$

B. $w_H(\text{BIN}(a_j \text{ AND } p_i)) < w_H(\text{BIN}(a_j))$ [Equation 4]

Herein, condition A may be a condition occurring because only previous information bits need to be used to generate the parity bit; condition B may be a condition that the minimum distance of a code needs to increase through the parity-check code.

A process of generating a parity node will be described in more detail with reference to FIGS. 3 and 4 as follows.

Figure 3:
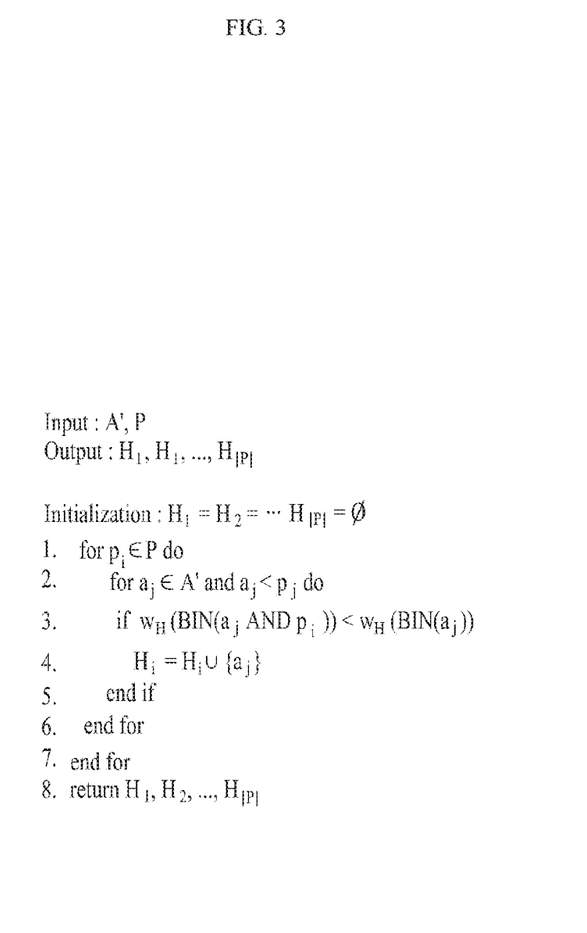
FIG. 3 illustrates one exemplary view of an algorithm for constructing a parity node.

FIG. 3 illustrates one exemplary view of an algorithm for constructing a parity node. FIG. 4 illustrates a progress view of a process of constructing a parity node algorithm.

Figure 4:
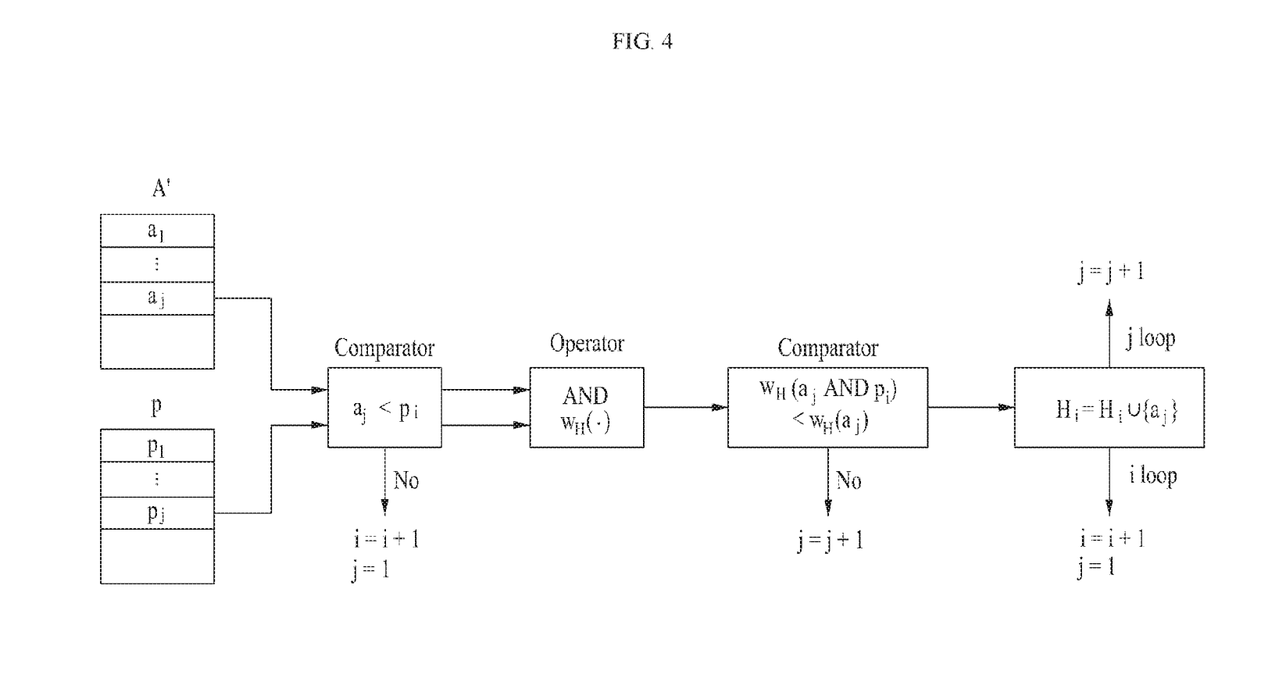
FIG. 4 illustrates a progress view of a process of constructing a parity node algorithm.

Referring to FIGS. 3 and 4, a process of generating a parity node is a process of outputting a parity node by using a candidate set and a parity set of an information set as an input and includes an outer loop for changing respective indexes $p_i$ of the parity set and an inner loop for adding the index of the candidate set that satisfies B in Equation 4 as elements of the parity node with respect to indexes $a_j$ of candidate sets less than the corresponding index $p_i$ of the parity set.

That is, the parity set includes 'i' indexes; when the candidate set includes 'j' indexes, the elements of candidate set included in the i-th parity node $H_i$ may be determined by comparing the parity set of index $p_i$ with the candidate set of indexes $a_j$ by using the comparator, finding the index $a_j$ of the candidate set smaller than index $p_i$ to apply the weight operator, and comparing a weight value of the sum of a vector for index $p_i$ and a vector for the corresponding index $a_j$ with a weight value of a vector for the corresponding index $a_j$. For example, when the weight value of the logical product of a vector for the index $p_i$ and a vector for the corresponding index $a_j$ is less than a weight value of a vector for the corresponding index $a_j$, a parity node $H_i$ capable of improving the minimum distance and error correction capability may be generated by including the corresponding index $a_j$ as an element of the parity node $H_i$.

This process may be repeatedly performed with respect to each index $p_i$ of the parity set and each index $a_j$ of the candidate set. For example, when the index of a candidate set smaller than index $p_1$ is satisfied by performing step 3 in the algorithm of FIG. 3 on the index of a candidate set, the index of the candidate set in the parity node $H_1$ may be included. The above-described process may be performed sequentially on all indexes of the candidate set (i.e., the process is performed sequentially using an inner loop through j=j+1), and then this process may be performed on index $p_2$ (i.e., i=i+1). All parity nodes, that is, $H_1$ to $H_i$, may include the candidate set of elements by performing this process up to the index $p_i$.

Figure 5:
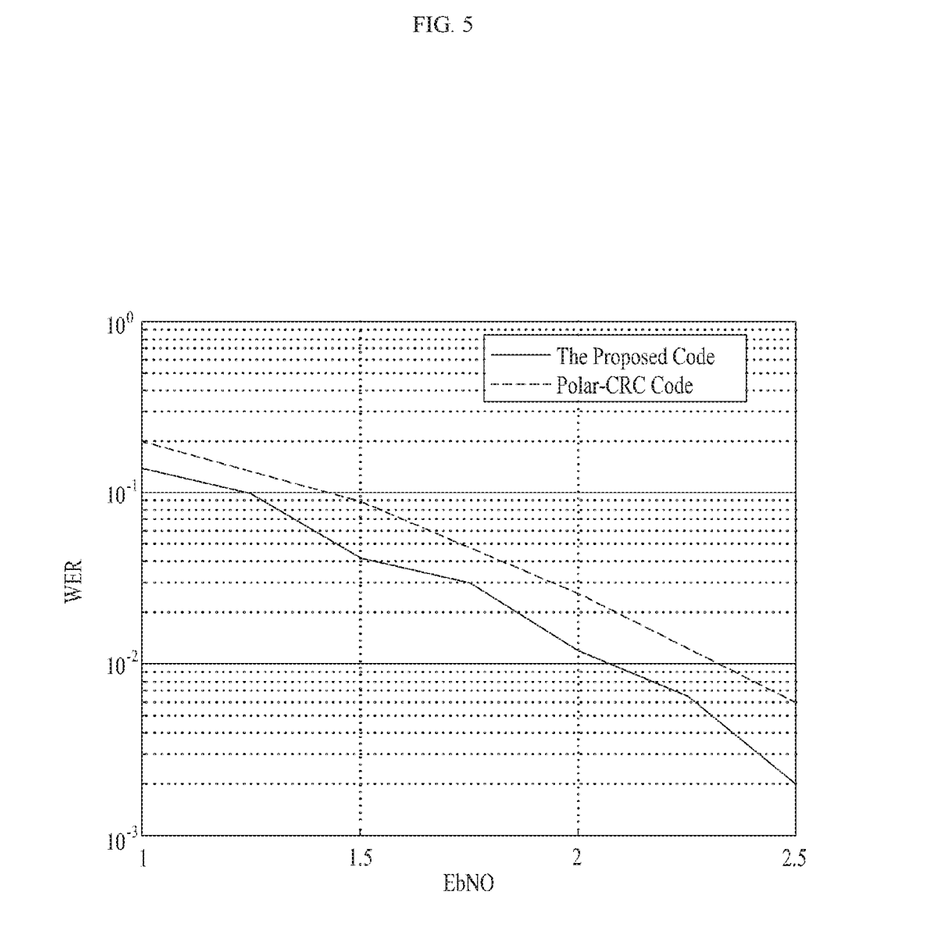
FIG. 5 shows an exemplary diagram in which the performance of the conventional code is compared with the performance of the method according to an embodiment of the inventive concept.

FIG. 5 shows an exemplary diagram in which the performance of the conventional code is compared with the performance of the method according to an embodiment of the inventive concept, and shows the results of performance comparison experiments for the conventional code (polar-CRC code) and the method (the proposed code) according to an embodiment of the inventive concept for length 256, code rate 1/2, and additive white Gaussian noise (AWGN) channel.

As understood through FIG. 5, in the method according to an embodiment of the inventive concept, it may be seen that the minimum distance is extended compared with the conventional code (polar-CRC code) by constructing a polar code from concatenating the polar code and the parity-check code, and it may be seen that the error correction capability also outperforms the conventional code.

Besides, the method according to an embodiment of the inventive concept may improve the minimum distance of the code, and may construct the code with excellent error correction capability when the code length is less than 200) compared to the widely-used turbo code or low-density-parity-check codes.

As such, the method according to an embodiment of the inventive concept may improve the minimum distance and error correction capability of a code by concatenating a polar code and a parity-check code. Accordingly, the method according to an embodiment of the inventive concept may be used as an error correction code for data transmission of 5G eMBB control signal and URLLC by applying the code; furthermore, the method according to an embodiment of the inventive concept may be applied to various fields (e.g., VR devices, Internet of Things, data centers, semiconductor storage devices, and the like) where the code according to an embodiment of the inventive concept may be used.

That is, the inventive concept is a method of constructing a polar code concatenated with a parity-check code. As described above, the inventive concept receives a code length, a message length, and channel information, generates an information set and a parity set of polar codes based on the received code length, the received message length, and the received channel information, and constructs a polar code concatenated with a parity-check code based on the generated information set and the generated parity set.

Herein, as described above, a process of generating the parity set may include a process of generating indexes, each of which is not greater than a preset Hamming weight among all indexes, as a frozen set of the polar codes, a process of generating indexes, which are selected by a preset scheme among remaining indexes other than indexes selected as the frozen set, as a parity set, and a process of generating indexes other than indexes selected as the parity set among the remaining indexes, as the information set.

Of course, other contents may also include all contents described with reference to FIGS. 1 to 5.

Figure 6:
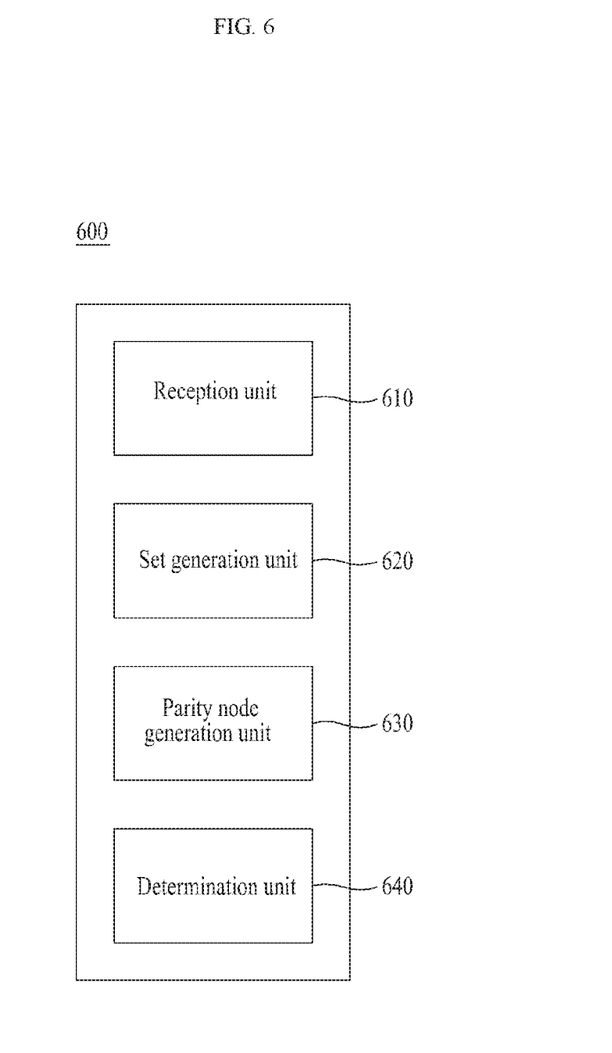
FIG. 6 shows a configuration for a polar code constructing apparatus according to an embodiment of the inventive concept.

FIG. 6 shows a configuration for a polar code constructing apparatus according to an embodiment of the inventive concept, and illustrates a conceptual configuration of an apparatus for performing the methods of FIGS. 1 to 5.

Referring to FIG. 6, an apparatus 600 according to an embodiment of the inventive concept includes a reception unit 610, a set generation unit 620, a parity node generation unit 630, and a determination unit 640.

The reception unit 610 receives a code length of 'N', a message length of 'k', and a channel of 'W' (the matrix indicating channel characteristics).

The set generation unit 620 may generate an information set and a parity set of polar codes based on the received code length, the received message length, and the received channel information.

Herein, the set generation unit 620 may generate indexes, each of which is not greater than a preset Hamming weight among all indexes for the N×N matrix of the polar code, as a frozen set of polar codes, may generate indexes, which are selected by a preset scheme among the remaining indexes other than indexes selected as the frozen set, as a parity set, and may generate indexes other than the indexes selected as the frozen set and the parity set among all indexes, as the information set.

At this time, the set generation unit 620 may select the parity set of indexes by calculating a Bhattacharyya parameter of the polarized channel. In particular, step S220 may calculate the Bhattacharyya parameter of the polarized channel with respect to the remaining indexes other than the indexes selected as the frozen set. After sorting the calculated Bhattacharyya parameter, step S220 may generate a parity set by selecting the indexes for the upper scale of the remaining number other than the number for the indexes of the information set.

When the frozen set, the information set, and the parity set of polar codes are generated by step S220, i.e., when the frozen set, the information set, and the parity set of the indexes are selected, the parity node generation unit 630 generates a parity node of the parity-check code based on the generated parity set and information set.

At this time, the parity node generation unit 630 may find indexes (information indexes), each of which is smaller than the corresponding index of the parity set, from among the information set of indexes with respect to the parity set of respective indexes, and may generate a parity node by determining the information set of elements included in each parity node based on a weight value of the sum of a vector for the corresponding index of the parity set and a vector for each of information indexes and a weight value of a vector for each of information indexes. For example, the parity node generation unit 630 may generate a parity node by determining the information index at the time when the weight value for the logical product of the vector for the corresponding index of the parity set and the vector for each of the information indexes is less than a weight value for the vector for each of the information indexes, as the information set of elements included in the corresponding parity node.

the determination unit 640 calculates a weight value of a vector corresponding to each of indexes of the parity set and a weight value of a vector corresponding to each of indexes of the information set and determines indexes of the information set having a weight value, which is not greater than a highest weight value, from among weight values for respective indexes of the parity set as a candidate set.

Accordingly, when the candidate set is determined by the determination unit 640, the parity node generation unit 630 may generate a parity node including the candidate set of elements based on the candidate set and the parity set.

Even though the description in the polar code constructing apparatus illustrated in FIG. 6 is omitted, it will be apparent to those skilled in the art that the polar code constructing apparatus according to an embodiment of the inventive concept may include all content described in FIGS. 1 to 5.

The above-described system or device may be implemented with hardware elements, software elements, and/or a combination of hardware elements and software elements. For example, the systems, devices, and components described in the exemplary embodiments of the inventive concept may be implemented in one or more general-use computers or special-purpose computers, such as a processor, a controller, an arithmetic logic unit (ALU), a digital signal processor, a microcomputer, a field programmable array (FPA), a programmable logic unit (PLU), a microprocessor or any device which may execute instructions and respond. A processing unit may perform an operating system (OS) or one or software applications running on the OS. Further, the processing unit may access, store, manipulate, process and generate data in response to execution of software. It will be understood by those skilled in the art that although a single processing unit may be illustrated for convenience of understanding, the processing unit may include a plurality of processing elements and/or a plurality of types of processing elements. For example, the processing unit may include a plurality of processors or one processor and one controller. Also, the processing unit may have a different processing configuration, such as a parallel processor.

Software may include computer programs, codes, instructions or one or more combinations thereof and configure a processing unit to operate in a desired manner or independently or collectively control the processing unit. Software and/or data may be permanently or temporarily embodied in any type of machine, components, physical equipment, virtual equipment, computer storage media or units or transmitted signal waves so as to be interpreted by the processing unit or to provide instructions or data to the processing unit. Software may be dispersed throughout computer systems connected via networks and be stored or executed in a dispersion manner. Software and data may be recorded in one or more computer-readable storage media.

The methods according to the above-described example embodiments may be recorded in computer-readable media including program instructions to implement various operations embodied by a computer. The computer-readable medium may also include the program instructions, data files, data structures, or a combination thereof. The program instructions recorded in the media may be designed and configured for the example embodiments or be known and available to those skilled in computer software. The computer-readable medium may include hardware devices, which are specially configured to store and execute program instructions, such as magnetic media (e.g., a hard disk, a floppy disk, or a magnetic tape), optical recording media (e.g., CD-ROM and DVD), magneto-optical media (e.g., a floptical disk), read only memories (ROMs), random access memories (RAMs), and flash memories. Examples of program instructions include not only machine language codes created by a compiler, but also high-level language codes that are capable of being executed by a computer by using an interpreter or the like. The described hardware devices may be configured to act as one or more software modules to perform the operations of the above-described exemplary embodiments of the inventive concept, or vice versa.

While embodiments have been shown and described with reference to the accompanying drawings, it will be apparent to those skilled in the art that various modifications and variations can be made from the foregoing descriptions. For example, adequate effects may be achieved even if the foregoing processes and methods are carried out in different order than described above, and/or the aforementioned elements, such as systems, structures, devices, or circuits, are combined or coupled in different forms and modes than as described above or be substituted or switched with other components or equivalents.

Therefore, other implements, other embodiments, and equivalents to claims are within the scope of the following claims.

According to an embodiment of the inventive concept, it is possible to improve the minimum distance and the error correction capability of a code by concatenating a polar code and a parity-check code.

In the case where the inventive concept is used, when the code length is less than 2000 compared to the widely-used turbo code or low-density-parity-check codes, the code with excellent error correction capability may be constructed; it may be used as an error correction code for data transmission of 5G eMBB control signal and URLLC by applying the code.

The inventive concept may be utilized in fields that are sensitive to errors and require high data processing speed, such as autonomous vehicles, data centers, telemedicine, and unmanned factories and may be applied to other industries that require error correction codes, such as virtual reality (VR) devices, Internet of Things, data centers, semiconductor storage devices, and the like.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method for constructing a polar code, the method comprising:
   receiving a code length, a message length, and channel information relating to a polarized channel;
   generating an information set of indexes and a parity set of indexes with respect to elements of polar codes based on the received code length, the received message length, and the received channel information;
   generating a parity node of a parity-check code based on the generated information set of indexes and the generated parity set of indexes, the parity node including a set of elements corresponding to the information set of indexes;
   constructing the polar code based on the parity-check code; and
   performing an error correction based on the constructed polar code.

2. The method of claim 1, wherein the generating of the parity set of indexes includes:
   generating indexes, each of which corresponds to a Hamming weight that is not greater than a preset Hamming weight, as a frozen set of indexes with respect to elements of the polar codes;
   generating indexes, which are selected by a preset scheme among remaining indexes other than indexes generated as the frozen set of indexes, as the parity set of indexes; and
   generating indexes other than indexes generated as the parity set of indexes among the remaining indexes, as the information set of indexes.

3. The method of claim 2, wherein the generating of the indexes as the parity set of indexes includes:
   calculating a Bhattacharyya parameter of the polarized channel with respect to the remaining indexes other than indexes generated as the frozen set of indexes; and
   generating indexes for an upper scale having a specific number as the parity set of indexes after sorting the calculated Bhattacharyya parameter.

4. The method of claim 1, wherein the generating of the parity node includes:
   finding, from among the information set of indexes, information indexes, each of which is smaller than a corresponding index of the parity set; and
   generating a parity node by determining the set of elements included in the respective parity node based on a weight value of the sum of a vector for the corresponding index and a vector for each of the information indexes and a weight value of a vector for each of the information indexes.

5. The method of claim 4, wherein the generating of the parity node includes:
   generating a parity node by determining an information index at a time when a weight value for a logical product of a vector for the corresponding index and a vector for each of the information indexes is less than a weight value for a vector for each of the information indexes, as the set of elements included in a corresponding parity node.

6. The method of claim 1, further comprising:
   calculating a weight value of a binary vector corresponding to each index of the parity set and a weight value of a binary vector corresponding to each index of the information set; and determining indexes of the information set having a weight value, which is not greater than a highest weight value, from among weight values for the respective indexes of the parity set as a candidate set of indexes, wherein the generating of the parity node includes:
generating the parity node including elements corresponding to the candidate set of indexes based on the candidate set of indexes and the parity set of indexes.

7. A method for constructing a polar code, the method comprising:
receiving a code length, a message length, and channel information relating to a polarized channel;
generating an information set of indexes and a parity set of indexes with respect to elements of polar codes based on the received code length, the received message length, and the received channel information;
generating a parity-check code based on the generated information set of indexes and the generated parity set of indexes;
constructing a polar code concatenated with the parity-check code; and
performing an error correction based on the constructed polar code.

8. The method of claim 7, wherein the generating of the parity set of indexes includes:
generating indexes, each of which corresponds to a Hamming weight that is not greater than a preset Hamming weight, as a frozen set of indexes with respect to elements of the polar codes;
generating indexes, which are selected by a preset scheme among remaining indexes other than indexes selected as the frozen set, as the parity set of indexes; and
generating indexes other than indexes generated as the parity set of indexes among the remaining indexes, as the information set of indexes.

9. The method of claim 8, wherein the generating of the indexes as the parity set of indexes includes:
calculating a Bhattacharyya parameter of the polarized channel with respect to the remaining indexes other than indexes generated as the frozen set of indexes; and
generating indexes for an upper scale having a specific number as the parity set after sorting the calculated Bhattacharyya parameter.

10. The method of claim 7, wherein the constructing of the polar code includes:
finding, from among the information set of indexes, information indexes, each of which is smaller than a corresponding index of the parity set; and
generating a parity node by determining the set of elements included in the respective parity node based on a weight value of the sum of a vector for the corresponding index and a vector for each of the information indexes and a weight value of a vector for each of the information indexes.

11. The method of claim 7, further comprising:
calculating a weight value of a binary vector corresponding to each index of the parity set and a weight value of a binary vector corresponding to each index of the information set; and
determining indexes of the information set having a weight value, which is not greater than a highest weight value, from among weight values for the respective indexes of the parity set as a candidate set of indexes, wherein the constructing of the polar code includes:
constructing the polar code concatenated with the parity-check code by generating a parity node including a set of elements corresponding to the candidate set of indexes based on the candidate set of indexes and the parity set of indexes.

12. A polar code constructing apparatus comprising one or more processors configured to:
receive a code length, a message length, and channel information relating to a polarized channel;
generate an information set of indexes and a parity set of indexes with respect to elements of polar codes based on the received code length, the received message length, and the received channel information; and
generate a parity node of a parity-check code based on the generated information set of indexes and the generated parity set of indexes, the parity node including a set of elements corresponding to the information set of indexes; and
construct a polar code based on the parity-check code such that an error correction is performed based on the constructed polar code.

13. The polar code constructing apparatus of claim 12, wherein the one or more processors are configured to:
generate indexes, each of which corresponds to a Hamming weight that is not greater than a preset Hamming weight, as a frozen set of indexes with respect to elements of the polar codes,
generate indexes, which are selected by a preset scheme among remaining indexes other than indexes generated as the frozen set of indexes, as the parity set of indexes, and
generate indexes other than indexes generated as the parity set of indexes among the remaining indexes, as the information set of indexes.

14. The polar code constructing apparatus of claim 13, wherein the one or more processors are configured to:
calculate a Bhattacharyya parameter of the polarized channel with respect to the remaining indexes other than indexes generated as the frozen set of indexes, and
generate indexes for an upper scale having a specific number as the parity set of indexes after sorting the calculated Bhattacharyya parameter.

15. The polar code constructing apparatus of claim 12, wherein the one or more processors are configured to:
find, from among the information set of indexes, information indexes, each of which is smaller than a corresponding index of the parity set; and
generate a parity node by determining the set of elements included in the respective parity node based on a weight value of the sum of a vector for the corresponding index and a vector for each of the information indexes and a weight value of a vector for each of the information indexes.

16. The polar code constructing apparatus of claim 15, wherein the one or more processors are configured to generate a parity node by determining an information index at a time when a weight value for a logical product of a vector for the corresponding index and a vector for each index of the information indexes is less than a weight value for a vector for each of the information indexes, as the set of elements included in a corresponding parity node.

17. The polar code constructing apparatus of claim 12, wherein the one or more processors are further configured to:
calculate a weight value of a binary vector corresponding to each index of the parity set and a weight value of a binary vector corresponding to each index of the information set;

determine indexes of the information set having a weight value, which is not greater than a highest weight value, from among weight values for the respective indexes of the parity set as a candidate set of indexes; and
generate the parity node including elements corresponding to the candidate set of indexes based on the candidate set of indexes and the parity set of indexes.

\* \* \* \* \*